(12) United States Patent
Odegard et al.

(10) Patent No.: US 8,674,504 B2
(45) Date of Patent: Mar. 18, 2014

(54) WIRE-BASED METHODOLOGY OF WIDENING THE PITCH OF SEMICONDUCTOR CHIP TERMINALS

(75) Inventors: Charles Anthony Odegard, McKinney, TX (US); Marvin Wayne Cowens, Plano, TX (US); Jaimal Mallory Williamson, McKinney, TX (US)

(73) Assignee: Texas Systems Incorporated, Dallas, TX (US)

( * ) Notice: Subject to any disclaimer, the term of this patent is extended or adjusted under 35 U.S.C. 154(b) by 0 days.

(21) Appl. No.: 13/476,158

(22) Filed: May 21, 2012

(65) Prior Publication Data
US 2013/0307141 A1   Nov. 21, 2013

(51) Int. Cl.
*H01L 23/48* (2006.01)
(52) U.S. Cl.
USPC .......................................................... 257/737
(58) Field of Classification Search
USPC .......................... 257/737, 691, 693, 697, 738
See application file for complete search history.

(56) References Cited

U.S. PATENT DOCUMENTS

| | | | | |
|---|---|---|---|---|
| 4,999,700 A | * | 3/1991 | Dunaway et al. | 257/666 |
| 8,026,589 B1 | * | 9/2011 | Kim et al. | 257/690 |
| 2002/0195614 A1 | * | 12/2002 | Tay et al. | 257/178 |
| 2003/0085459 A1 | * | 5/2003 | Akram et al. | 257/691 |
| 2008/0067660 A1 | * | 3/2008 | Kim et al. | 257/686 |

* cited by examiner

*Primary Examiner* — Nathan Ha
(74) *Attorney, Agent, or Firm* — Steven A. Shaw; Wade James Brady, III; Frederick J. Telecky, Jr.

(57) ABSTRACT

A packaged semiconductor device (100) comprising a semiconductor chip (101) of an area having a first surface (101*a*) including a plurality of bond pads (102) linearly arrayed, adjacent pads having a first pitch (103) center-to-center; an insulating layer (110) on the first chip surface covering the chip area, the layer having a height (116) and a second surface (110*a*) parallel to the first surface; the second surface including contact nodes (120) in staggered array, the nodes having the same plurality as the pads, adjacent nodes having a second pitch (121) center-to-center greater than the first pitch; and metal wires through the layer height connecting the pads to respective nodes.

21 Claims, 12 Drawing Sheets

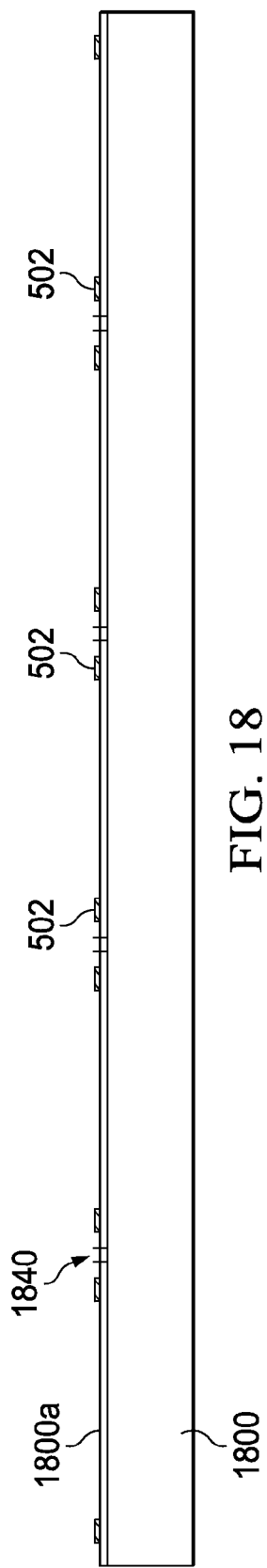
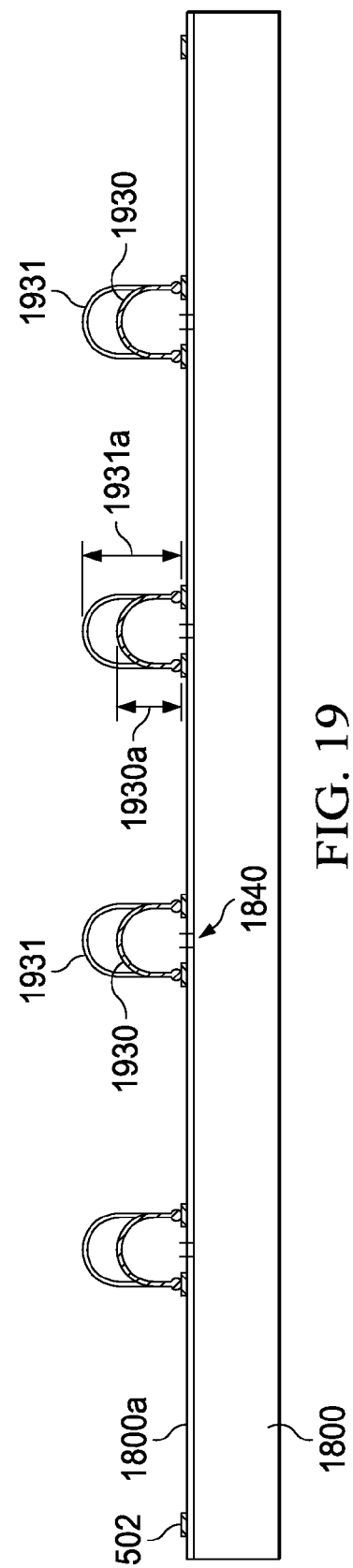

WIRE-BASED METHODOLOGY OF WIDENING THE PITCH OF SEMICONDUCTOR CHIP TERMINALS

FIELD OF THE INVENTION

The present invention is related in general to the field of semiconductor devices and processes, and more specifically to the structure and fabrication method of semiconductor packages integrated with a substrate for enlarged terminal pitch and flip-chip or modular interconnection.

DESCRIPTION OF RELATED ART

Among the ongoing trends in semiconductor chips are strong market pressures requiring ever higher numbers of chip input-output terminals in combination with shrinking pitch between terminals center-to-center to keep the chip dimensions small. To give an example, the pitch between terminals center-to-center of typical chips may be between 40 and 100 μm, with the market pushing towards smaller pitches. It is common practice for easier handling to expand the pitch between terminals into a wider range by mounting the chips onto leadframes or substrates. For assembly onto leadframes, the chip terminals are generally wire-bonded to the narrow-pitch inner portions of metal leads which fan out spreading to wide-pitch outer leads. For assembly onto substrates, the chip terminals are flip-assembled onto conductive traces, which are laid out to spread from narrow pitch between leads at the substrate center to wider pitch at the substrate perimeter. Both leadframes and substrates can thus spread the pitch of electrical terminals from the range of micrometers to the range of millimeters.

As an example for semiconductor chips in QFN/SON packages, the pitch of 50 μm center-to-center between chip terminals can be extended to solderable package contacts between about 0.5 to 1.0 mm; for small packages of 1×1 mm side length, the pitch between contact may be as small as 200 μm, just enough to prevent shorting by solder reflow. Similar numbers for expanding the pitch of chip terminals can be achieved by traces of substrates, especially when the substrates are constructed with multi-level metal levels. However, leadframes as well as substrates are expensive technical solutions; leadframes are traditionally the most expensive part of any package, and substrates with multi-level traces carry high price tags.

SUMMARY OF THE INVENTION

Applicants realized that the penetration of packaged semiconductor devices, especially those with high numbers of input/output terminals, into promising emerging consumer products are often hampered because the package cost cannot be reduced fast enough. In most cases, the major hurdle for cost reduction is the inherent cost of metallic leadframes and of multi-level substrates, which are presently both needed to transform the tight pitch of chip terminals to the more practical pitch of the device package.

Applicants solved the problem of abandoning package leadframes as well as package substrates, when they discovered a methodology to use computer-controlled wire bonding for transforming the tight pitch of chip terminals to the wider pitch of package terminals. The new methodology includes a low-cost batch process flow based on wafer-scale processing and thus not lonely omit the cost of the piece parts (leadframe or substrate), but also lends itself to simplifications of chip assembly and packaging. In a first embodiment, the methodology produces wide-pitched package contacts on the package surface, enabling direct package attachment to boards. In a second embodiment, the methodology creates wide-pitched contacts on the package sides, enabling modular package arrangements.

In a first embodiment of the invention, a semiconductor wafer with a plurality of chips is selected; the chips have bond pads linearly arrayed, and adjacent pads of a chip have a first pitch center-to-center. In contrast to and deviation from traditional use of bonding wires, the methodology is based on spanning wires across the scribe street between adjacent chips in order to interconnect respective bond pads of adjacent chips. A computer-controlled bonder is able to arch adjacent wire spans so that a span with a first width alternates with a span of a second width greater than the first width. After spanning the arches across all scribe streets, a layer of insulating material is deposited on the wafer surface with a height suitable to embed the spans of the first and second widths; the material is then hardened.

Using a back-grinding technique, the layer height is reduced by removing insulating material together with portions of the wire spans, whereby the wire spans are cut and a second surface of the layer material is created. Grooves are then formed by indenting the second surface contiguous with the cut wires; the wire ends are exposed in the grooves. The grooves are then filled, at least partially, with conductive material adhering to the wire ends so that the filled grooves become contact nodes with the same plurality as the chip pads. However, since the bonding wires had alternating spans, adjacent contact nodes are positioned in a staggered array with a second pitch center-to-center greater than the first pitch.

The wafer is now ready to be singulated by sawing into discrete devices, wherein the layer of insulating material serves as the package of each unit.

In a second embodiment of the invention, a semiconductor wafer has a plurality of chips with bond pads linearly arrayed, and adjacent pads of a chip have a first pitch center-to-center. In contrast to and deviation from traditional use of bonding wires, the methodology is based on spanning wires across the scribe street between adjacent chips in order to interconnect respective bond pads of adjacent chips. A computer-controlled bonder is able to arch adjacent wire spans so that a span with a first height alternates with a span of a second height greater than the first height. After spanning the arches across all scribe streets, a layer of insulating material is deposited on the wafer surface with a height suitable to embed the spans of the first and second heights; the material is then hardened.

Using a saw, the wafer is singulated into discrete devices; this process step also cuts the wire span and creates sidewalls for the units, wherein respective sidewalls of the insulating layer and the semiconductor chip are coplanar. Grooves are then formed by indenting the insulating sidewalls contiguous with the cut wires, exposing the wire ends in the grooves. The grooves are then filled, at least partially, with conductive material adhering to the wire ends, so that the filled grooves become contact nodes with the same plurality as the chip pads. However, since the bonding wires had alternating heights, adjacent contact nodes are positioned in a staggered array with a second pitch center-to-center greater than the first pitch.

BRIEF DESCRIPTION OF THE DRAWINGS

FIG. 6 illustrates a cross section of a semiconductor wafer including a plurality of chips with contact pads.

FIG. 7 is a wafer cross section depicting the process step of wire bonding across chip scribe streets. Adjacent wires have different widths.

FIG. 8 illustrates a perspective view of a wafer portion including two adjacent chips showing the process steps of FIGS. 7, 9 and 10.

FIG. 9 is a wafer cross section showing the process step of depositing a layer of insulating material on the wafer surface, covering the wire spans.

FIG. 10 is a wafer cross section depicting the process step of removing a portion of the insulating layer including portions of the wire spans.

FIG. 11 shows a wafer cross section after removal of a layer portion of insulating material and cuts through the wires.

FIG. 12 shows the cross section of a singulated chip.

FIG. 13 FIG. 7 is a wafer cross section depicting the process step of wire bonding across chip scribe streets and across wafer surface areas. Adjacent wires have different arch widths.

FIG. 18 illustrates a cross section of a semiconductor wafer including a plurality of chips with contact pads.

FIG. 19 is a wafer cross section depicting the process step of wire bonding across chip scribe streets. Adjacent wires have different heights.

DETAILED DESCRIPTION OF THE PREFERRED EMBODIMENTS

Figure 1:
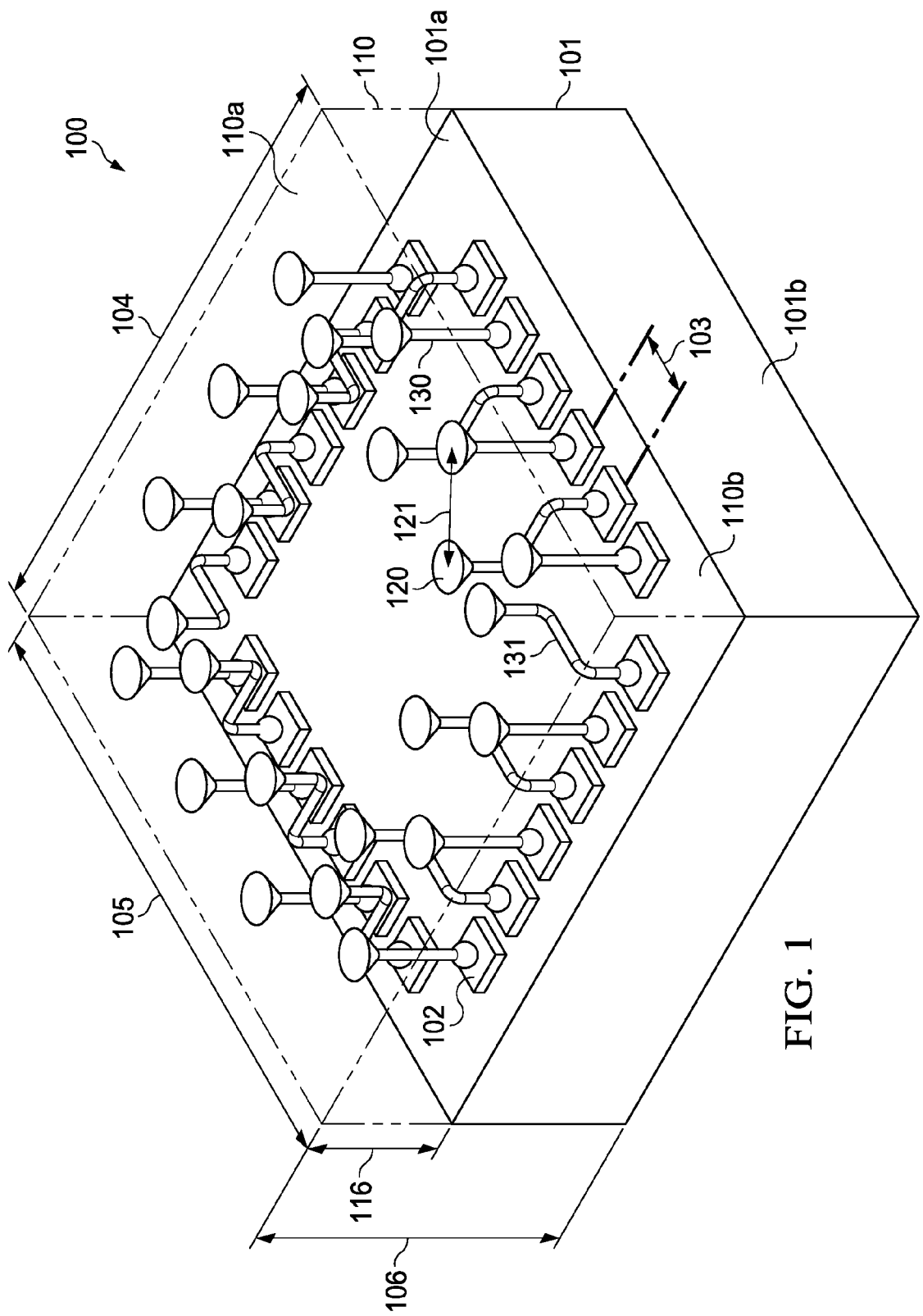
FIG. 1 illustrates a perspective view of a packaged semiconductor device with contact nodes in a staggered array, wherein the nodes have the same plurality as the chip terminal pads but a greater pitch center-to-center than the pitch of the pads. Respective nodes and pads are connected by bonding wires.

FIG. 1 shows an exemplary packaged semiconductor device generally designated 100, which has a chip 101 covered by an insulating layer 110 substituting as a substrate. Device 100 is shaped as a cuboid with lateral dimensions 104 and 105 and height 106. In FIG. 1, layer 110 is assumed to be transparent for explanatory reasons, while in reality layer 110 may be opaque and black. Chip 101 has a first surface 101a with an area, and layer 110 has a second surface with the same area as, and is parallel to, first surface 101a. Respective sidewalls of chip 101 and layer 110, such as chip sidewall 101b and layer sidewall 110b, are coplanar. Layer 110 has a height 116, which is a portion of device height 106. Preferred height 116 may be in the range from about 250 to 1000 µm.

Chip 101 has on its surface 101a a plurality of bond pads 102, which are linearly arrayed so that adjacent pads have a first pitch 103 center-to-center. While many chips have pad pitches 103 between 60 and 80 µm, strong market trends aim at considerably smaller pitches, for instance 50 µm, which represent big challenges for wire bonding and solder bumping. Layer 110 has on its surface 110a contact nodes 120 with the same plurality as bond pads 102, yet in staggered array. Consequently, adjacent nodes 120 have a second pitch 121 center-to-center greater than the first pitch 103. Second pitch 121 may be 2× to 6× greater than first pitch 103; preferred range of second pitch 121 is between 100 and 300 µm. A second pitch 121 greater than first pitch 103 may also allow contact nodes with a larger area than the chip bond pad area. Contact nodes 120 serve as contacts of device 100 to external parts.

Insulating layer 110 is preferably made of a polymeric material such as bisphenol A or bisphenol F, with inorganic fillers incorporated in the material. These polymers may be used separately or mixed as a blend. Compared to the more flexible structure of bisphenol A, bisphenol F is more rigid; by blending the two materials, a wide spectrum of characteristics between flexible and rigid can be obtained. The polymers are cured (polymerized) at a temperature between 175 and 200° C., generating thermal cross linking and hardening of the polymers. The inorganic fillers enhance the rigidity and increase the glass transition temperature, enabling the back grinding (polishing) of the cured polymers (process see below). Alternative polymeric materials include phenolic resin with a catalyst and biphenyl materials.

Metal wires 130 and 131 extend through the height 116 of layer 110 to connect bond pads 102 with respective contact nodes 120. Consequently nodes 120 serve as contacts of chip 101 and device 100 to external parts. As FIG. 1 illustrates, wires 130 have a length to provide substantially shortest-path connections between respective pads and nodes. Wires 130 alternate with wires 131. In contrast to wires 130, wires 131 have a length to provide connections between respective pads and nodes with a considerably longer path than shortest path, enabling the staggered positioning of nodes 120 and the large pitch 121. Processes for forming wires 131 see below.

Chip bond pads 102 have preferably conventional metal configurations; for instance, when wires 130 and 131 are made of gold, pads 102 are preferably made of an aluminum alloy; when the wires are made of copper, pads 102 are preferably made of copper or a metal bondable by including top layers of nickel, palladium, and gold. In contrast, contact nodes 120 may be selected from a group of metallurgical combinations in conjunction with the node formation depicted in FIGS. 2 to 4.

Figure 2:
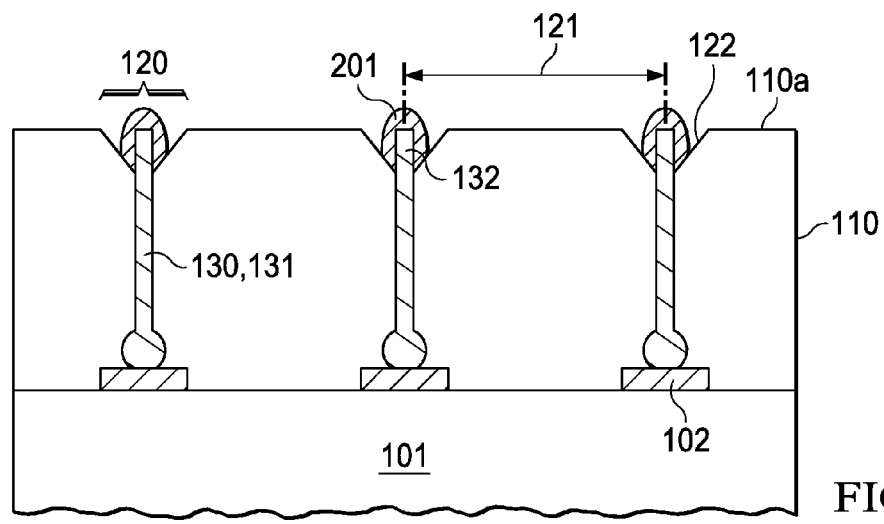
FIG. 2 shows a cross section through exemplary contact nodes comprising grooves partially filled with conductive material adhering to the bonding wires.
Figure 3:
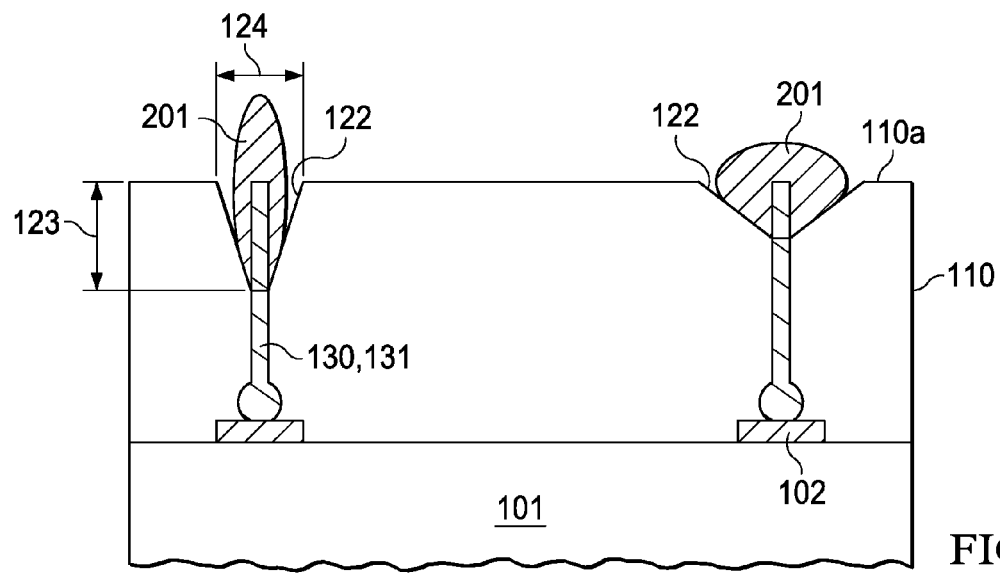
FIG. 3 depicts a cross section of grooves with various shapes.

FIGS. 2 and 3 depict configurations of contact nodes 120 based on a process, which starts by indenting grooves or dips 122 into the surface 110a of the insulating material of layer 110 contiguous with the ends 132 of wires 130, 131 at the layer surface (description of wire end formation see below). A preferred process for individual groove formation is laser ablation of the insulating material directly surrounding the wire ends; a preferred batch process for forming grooves around the wire ends includes a mask followed by wet or dry etching. More detail see below. As FIG. 3 indicates, the shape of the grooves may be selected between steep or shallow sidewalls, and narrow or wide openings. Preferred depths 123 of the grooves are in the range from approximately 5 µm to 15 µm, with the wire ends protruding from the groove bottom. Preferred openings 124 of the grooves may have a diameter greater than the common side length of chip bond pads 102, between 30 and 50 µm. As mentioned, pitch 121 center-to-center of contact nodes 120 is preferably between 50 and 300 µm.

In order to provide an easy way for contacting the wire end exposed in the groove, at least a portion of the groove needs to be filled with a conductive material 201, which is preferably solderable or bondable. Conductive material 201 may include a conductive paste, a solder, or a z-axis conductor. For solder, a preferred technique includes stencil application of solder into the pockets around each protruding wire, as indicated in FIG. 2. The amount of conductive material depends on the shape and volume of the grooves, as indicated in FIG. 3. In a final process step for solder, the wafer is sent though a solder reflow oven so that the solders metallurgically join the wire ends.

Figure 4:
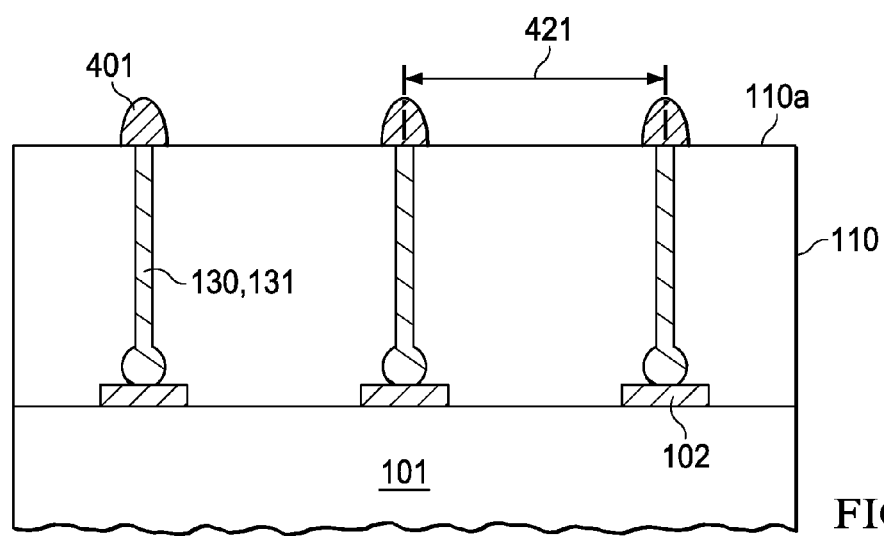
FIG. 4 shows a cross section through contact nodes comprising conductive bumps.

FIG. 4 shows an alternative process, wherein the conductive material, for instance solder, is deposited as a bump 401 on each end of wire 130/131 at surface 110a; the bump is contiguous with the wire end at surface 110a. Any existing bumping technology may be used. Pitch 421 center-to-center of bumps 401 is preferably between 50 and 300 µm, analogous to pitch 121.

Figure 5:
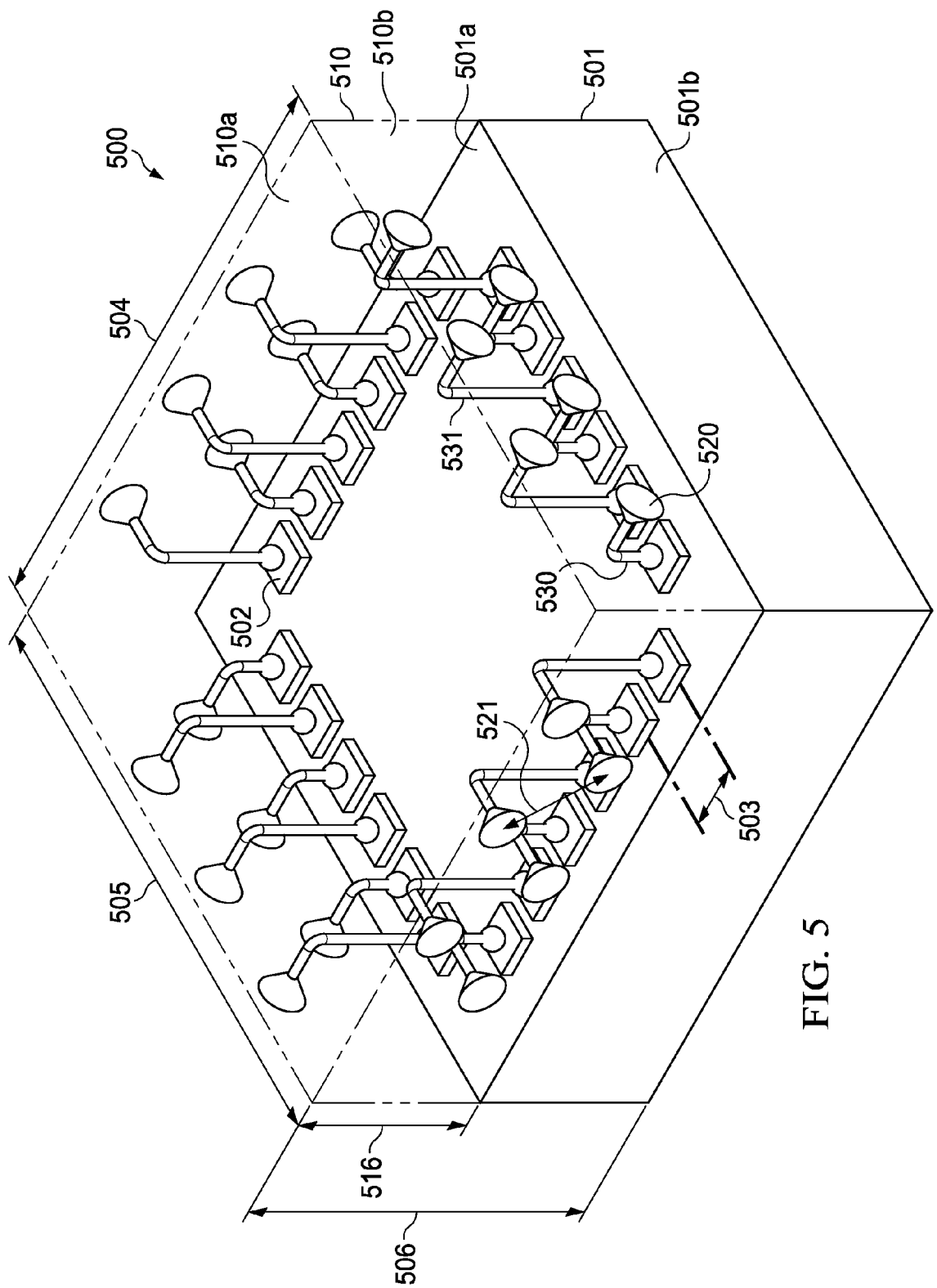
FIG. 5 illustrates a perspective view of a packaged semiconductor device with contact nodes in a staggered array on the side wall of the encapsulating package material, wherein the nodes have the same plurality as the chip terminal pads but a greater pitch center-to-center than the pitch of the pads. Respective nodes and pads are connected by bonding wires.

FIG. 5 illustrates another exemplary packaged semiconductor device generally designated 500, which has a chip 501 covered by an insulating layer 510 substituting as a substrate. Device 500 is shaped as a cuboid with lateral dimensions 504 and 505 and height 506. In FIG. 5, layer 510 is assumed to be transparent for explanatory reasons, while in reality layer 510 may be opaque and black. Chip 501 has a first surface 501a with an area and second surfaces 501b normal to the first surface 501a. Layer 510 has a third surface 510a with the same area as, and is parallel to, first surface 501a. Layer 510 further has fourth surfaces 510b normal to third surface 510a and coplanar with respective second surfaces 501b. Consequently, respective sidewalls of chip 501 and layer 510, such as chip sidewall 501b and layer sidewall 510b marked in FIG. 5, are coplanar. Layer 510 has a height 516, which is a portion of device height 506. Preferred height 516 may be in the range from about 500 to 2000 µm.

Chip 501 has on its surface 501a a plurality of bond pads 502, which are linearly arrayed so that adjacent pads have a first pitch 503 center-to-center. While many chips have pad pitches 503 between 60 and 80 µm, strong market trends aim at considerably smaller pitches, for instance 50 µm, which represent big challenges for wire bonding and solder bumping. Layer 510 has on its sidewalls (fourth surfaces) 510b contact nodes 520 with the same plurality as bond pads 502, yet in staggered array. Consequently, adjacent nodes 520 have a second pitch 521 center-to-center greater than the first pitch 503. Second pitch 521 may be 2× to 6× greater than first pitch 503; preferred range of second pitch 521 is between 100 and 300 µm. A second pitch 521 greater than first pitch 503 may also allow contact nodes with a larger area than the chip bond pad area. Contact nodes 520 serve as contacts of device 500 to external parts.

Insulating layer 510 is preferably made of a polymeric material such as bisphenol A or bisphenol F, with inorganic fillers incorporated in the material. These polymers may be used separately or mixed as a blend. Compared to the more flexible structure of bisphenol A, bisphenol F is more rigid; by blending the two materials, a wide spectrum of characteristics between flexible and rigid can be obtained. The polymers are cured (polymerized) at a temperature between 175 and 200° C., generating thermal cross linking and hardening of the polymers. The inorganic fillers enhance the rigidity and increase the glass transition temperature. Alternative polymeric materials include phenolic resin with a catalyst and biphenyl materials.

Metal wires 530 and 531 traverse inside layer 510 to connect bond pads 502 with respective contact nodes 520. Consequently nodes 520 serve as contacts of chip 501 and device 500 to external parts. As FIG. 5 illustrates, wires 530 have a length to provide substantially shortest-path connections between respective pads and nodes. Wires 530 alternate with wires 531. In contrast to wires 530, wires 531 have a length to provide connections between respective pads and nodes with a considerably longer path than shortest path, enabling the staggered positioning of nodes 520 and the large pitch 521. Processes for forming wires 531 see below.

Chip bond pads 502 have preferably conventional metal configurations; for instance, when wires 530 and 531 are made of gold, pads 502 are preferably made of an aluminum alloy; when the wires are made of copper, pads 502 are preferably made of copper or a metal bondable by including top layers of nickel, palladium, and gold. In contrast, contact nodes 520 may be selected from a group of metallurgical combinations in conjunction with the node formation depicted and described in FIGS. 2 to 4.

Figure 6:
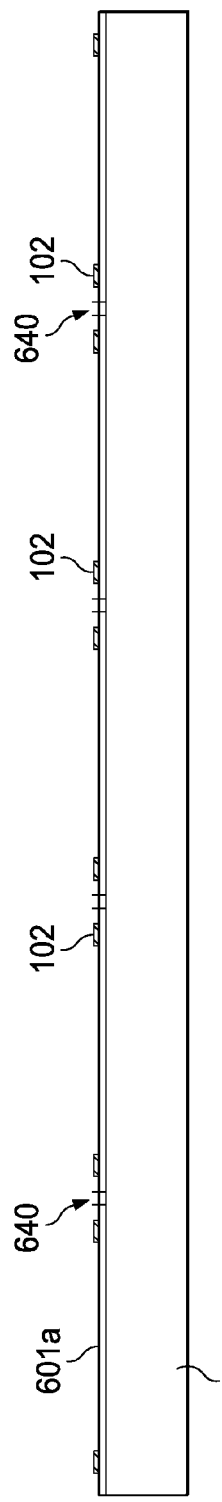
FIGS. 6 to 12 show process steps of a first embodiment.

Other embodiments of the invention are several process flows to fabricate the device structures of FIG. 1 and FIG. 5. Certain steps of one process flow, resulting in the device structure of FIG. 1, are depicted in FIGS. 6 thru 12; certain steps of another process flow, also resulting in the structure of FIG. 1, are shown in FIGS. 6,13 thru 17. The device structure of FIG. 5 can be fabricated by certain steps illustrated in FIGS. 18 thru 23. Since all processes are wafer-level batch processes, the flows start with FIG. 6 depicting the selection of a semiconductor wafer 601.

Figure 8:
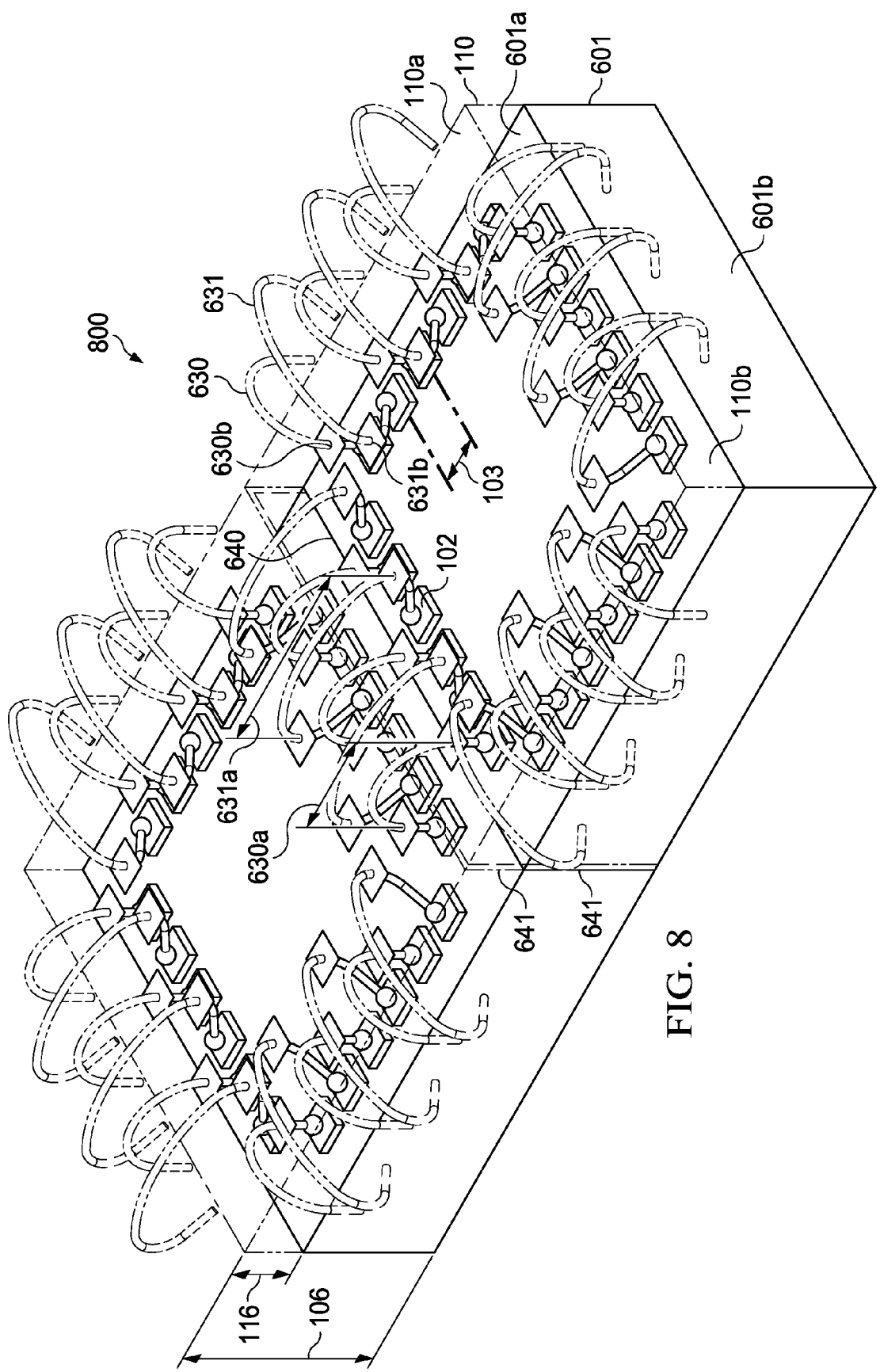

In FIG. 6, semiconductor wafer 601 has a first surface 601a including a plurality of chips with circuitry and bond pads 102. A couple of adjacent chips of wafer 601, together with some of their bond pads, are depicted in FIG. 8. Bond pads 102 are linearly arrayed (see FIG. 8) so that adjacent pads of a chip have a first pitch 103 center-to-center. In FIG. 6, the scribe streets between adjacent chips are designated 640; in FIG. 8, the future saw lines following the scribe streets are designated 641.

Figure 7:
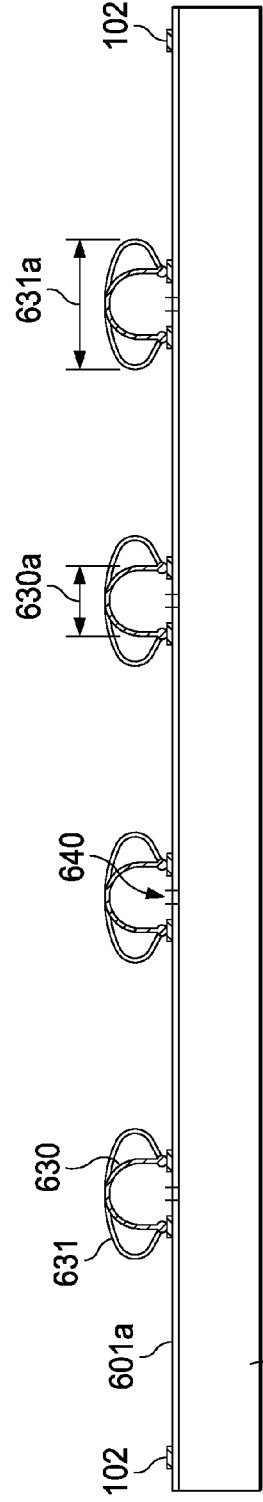

In the next process step, illustrated in FIGS. 7 and 8, bonding wires are spanned across scribe streets 640 between adjacent chips in order to interconnect bond pads 102, which face each other across the scribe street. As FIG. 8 shows, adjacent wires are spanned alternatively with a narrow and a wide arch. Wires forming narrow arches 630a are designated 630 and wires forming wide arches 631a are designated 631. Narrow arches 630a may preferably be in the range from about 60 to 100 µm, wide arches 631a in the range from about 100 to 400 µm. While the width of wire arches 631a differs greatly from the width of wire arches 630a, the apex of a wide arch has approximately the same height as the apex of a narrow arch, preferably between about 50 to 70 µm.

The spanning of wires and the curvature of the arches are computer-controlled and performed by automated wire bonders, which are commercially available from several companies (for instance Kulicke & Soffa in the US and Shinkawa in Japan). The dimensions and the stability of the arches are determined by the wire metal (for example gold, copper, aluminum and alloys), specific weight, fabrication and thermal history, and diameter (for example more or less than 25 µm). The stiffness of the wires is selected so that wire sagging is avoided. The preferred connecting method is ball bonding; alternatively, double-stitch bonding and wedge bonding may be used. In the preferred wire spanning method, narrow arches are formed so that the bonder capillary is first raised about vertically above the attached ball before the arching begins (see FIG. 8). Wide arches are formed so that the capillary moves the wire sidewise right after the heat-affected zone (see FIG. 8). A plane for forming surface 110a, determined by the stop of the back-grinding process described in FIG. 10, is safely remote from the heat-affected zone of wire 630, and further runs approximately through the widest excursion of wire 631.

Figure 9:
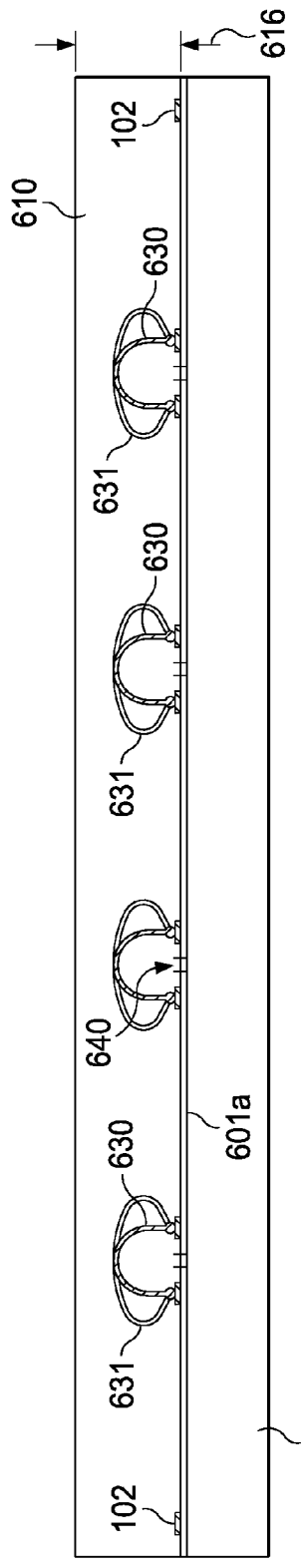

In the next process step, illustrated in FIG. 9, an insulating low-viscosity precursor 610 is deposited on surface 601a of wafer 601. The precursor may be an epoxy-based polymer as mentioned above which has been mixed with a fine distribution of inorganic fillers. Exploiting the low viscosity, the precursor is uniformly distributed for instance by spinning the wafer, without affecting the wire spans. After redistribution, precursor 610 forms an insulating layer with an approximately uniform height 616 sufficient to cover the apex of the arches of wires 630 and 631. Thereafter, precursor 610 is subjected to a time-temperature cycle for polymerizing and hardening the polymer. The hardened insulating material has been designated 110.

Figure 10:
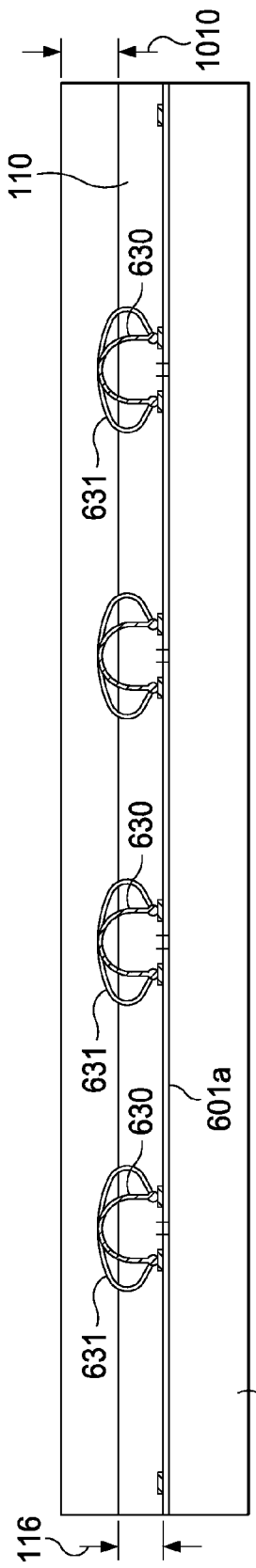
Figure 11:
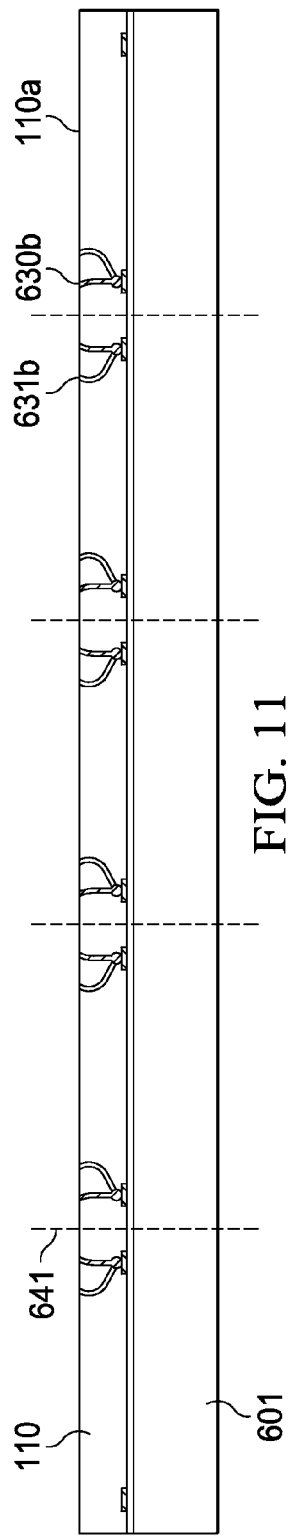
Figure 12:
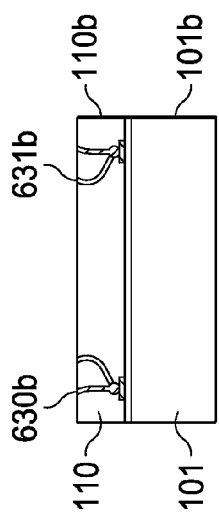

FIG. 10 indicates as the next step a back-grinding or polishing process to remove a thickness 1010 from hardened insulating material 610 and thus reduce the height 616 of the hardened insulating layer to the thickness 116 of device 100 indicated in FIG. 1. However, in the course of the back-grinding process, not only portions of hardened insulating material are removed, but also the tops of the wire loops 630 and 631, as indicated by dotted outlines in FIG. 8. The newly created surface 110a of the insulating material thus includes the cuts 630b through wires 630 and cuts 631b through wires 631; see FIG. 11. How these wire ends 630b and 631b are transformed into contact nodes 120 on surface 110a, is described above by the process steps illustrated in FIGS. 2 to 4. FIG. 11 further includes saw lines 641 along scribe streets 640, which cut through the insulating and semiconductor materials of the wafer to create discrete devices as shown in FIG. 12. The cutting step along the saw lines explains the fact that respective side walls 101b of the semiconductor material and side walls 110b of the insulting layer are coplanar.

Figure 14:
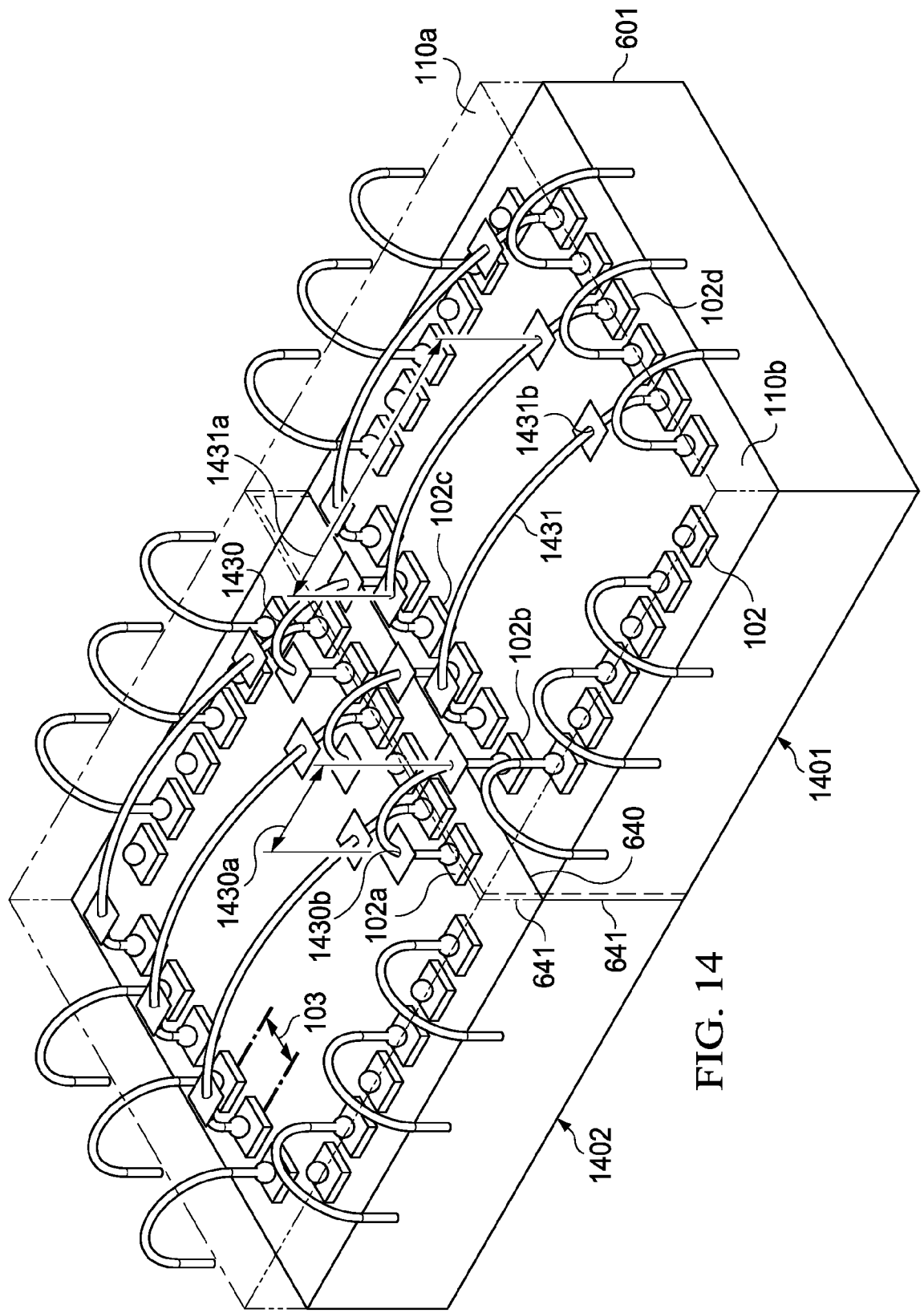
FIG. 14 illustrates a perspective view of a wafer portion including two adjacent chips showing the process steps of FIGS. 13, 15 and 16.

Another embodiment is an alternate process flow to fabricate a device with large-pitch staggered arrays of contact nodes based on a chip with small-pitch linear arrays of bonding pads, resulting in a device structure as shown in FIG. 1. The alternate process flow starts with a semiconductor wafer 601 as shown in FIG. 6. The wafer has a first surface 601a including a plurality of chips with circuitry and bond pads 102, and scribe streets 640 between the chips. A couple of adjacent chips of wafer 601, together with some of their bond pads, are depicted in FIG. 14; these adjacent chips are designated 1401 and 1402, respectively. Bond pads 102 are linearly arrayed so that adjacent pads of a chip have a first pitch 103 center-to-center. In FIG. 14, the future saw lines, following the scribe streets 640, are designated 641.

Figure 13:
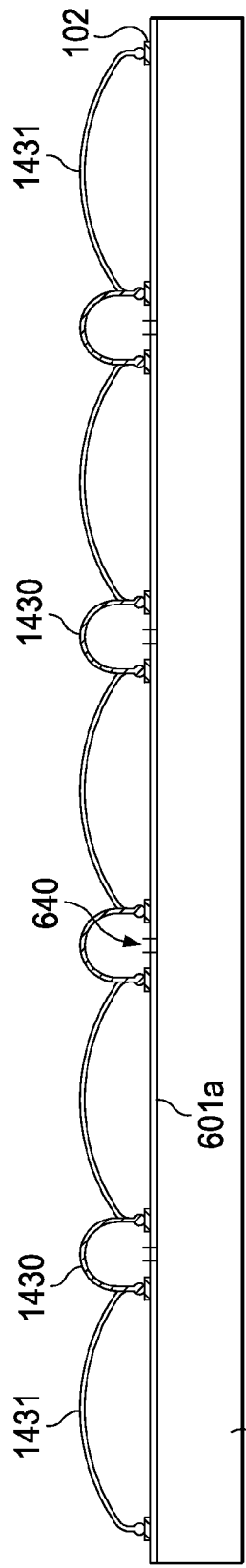

In the next process step, illustrated in FIGS. 13 and 14, bonding wires are spanned between pads 102 so that narrow arches alternate with wide arches. Wires designated 1430 are spanned across scribe street 640 so that a pad 102a of chip 1402 is connected to the facing pad 102b of chip 1401 across the scribe street 640 between chip 1402 and 1401. As FIG. 14 indicates, the narrow arches include wire portions near the ball and the stitch, which are approximately perpendicular to the wafer surface; these vertical portions are connected by the arch proper.

Alternating with the narrow arches of wires 1430, adjacent bonding wires 1431 form wide arches. Wires 1431 forming wide arches are spanned from a pad located at one edge of a chip to a pad at the opposite edge of the same chip, thus crossing the surface area of the chip. As an example, in FIG. 14, a wire 1431 is attached to pad 102c, adjacent to pad 102b, located at one chip edge; the wire is spanned in a wide arch across the surface of chip 1401 to be attached to pad 102d located at the opposite chip edge. As FIG. 14 indicates, the wire arches include wire portions near the ball and the stitch, which form acute angles with the wafer surface. As an example, narrow arches 1430a may be in the range from about 60 to 100 µm, as measured from wire attachment to wire attachment. Wide arches 1431a may be in the range from about 100 to 600 µm, as measured from wire attachment to wire attachment. While the width of wire arches 1431a differs greatly from the width of wire arches 630a, the apex of a wide arch has approximately the same height as the apex of a narrow arch, preferably between about 50 to 70 µm.

Figure 16:
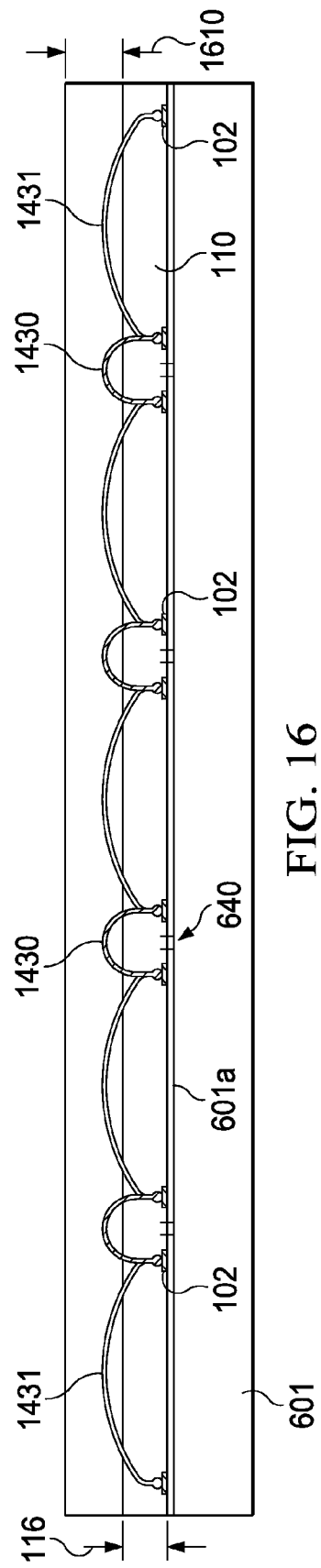
FIG. 16 is a wafer cross section depicting the process step of removing a portion of the insulating layer including portions of the wire spans.

The spanning of wires and the curvature of the arches are computer-controlled and performed by automated wire bonders. Metal, dimensions and stiffness of the wires are selected to avoid sagging of the wires. The preferred connecting method is ball bonding; alternatively, double-stitch bonding and wedge bonding may be used. A plane for forming surface 110a, determined by the stop of the back-grinding process described in FIG. 16, is safely remote from the heat-affected zone of wire 1430, and runs through wire 1430 at a region determining location 1430b on surface 110a. The plane of surface 110a further runs through two wire regions at a certain distance under the apex of wire 1431, which determine locations 1431b on surface 110a.

Figure 15:
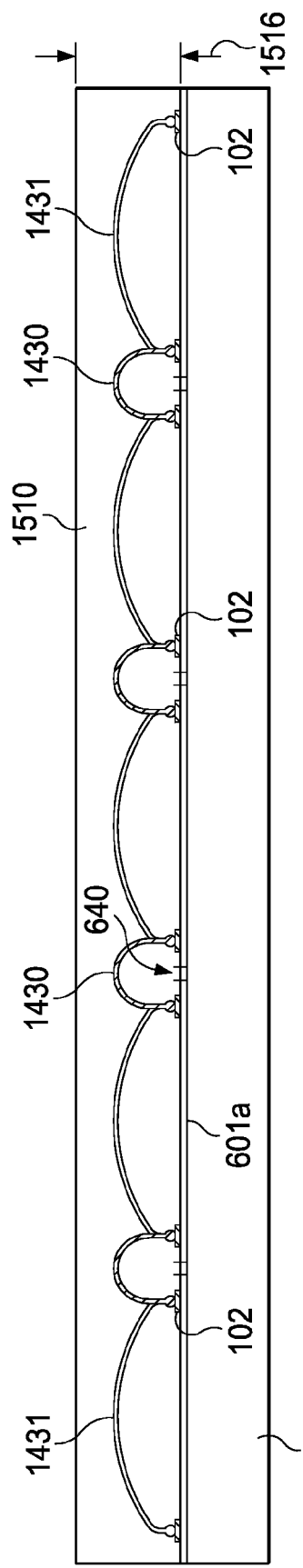
FIG. 15 is a wafer cross section showing the process step of depositing a layer of insulating material on the wafer surface, covering the wire spans.

In the next process step, illustrated in FIG. 15, an insulating low-viscosity precursor 1510 is deposited on surface 601a of wafer 601. The precursor may be an epoxy-based polymer as mentioned above which has been mixed with a fine distribution of inorganic fillers. Exploiting the low viscosity, the precursor is uniformly distributed for instance by spinning the wafer, without affecting the wire spans. After redistribution, precursor 1510 forms an insulating layer with an approximately uniform height 1516 sufficient to cover the apex of the arches of wires 1430 and 1431. Thereafter, precursor 1510 is subjected to a time-temperature cycle for polymerizing and hardening the polymer. The hardened insulating material has been designated 110.

Figure 17:
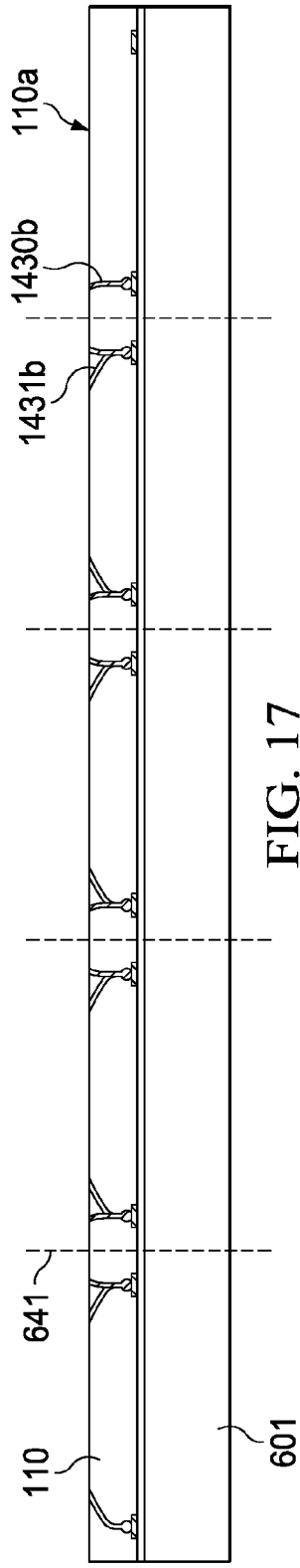
FIG. 17 shows a wafer cross section after removal of a layer portion of insulating material and cuts through the wires.
Figure 20:
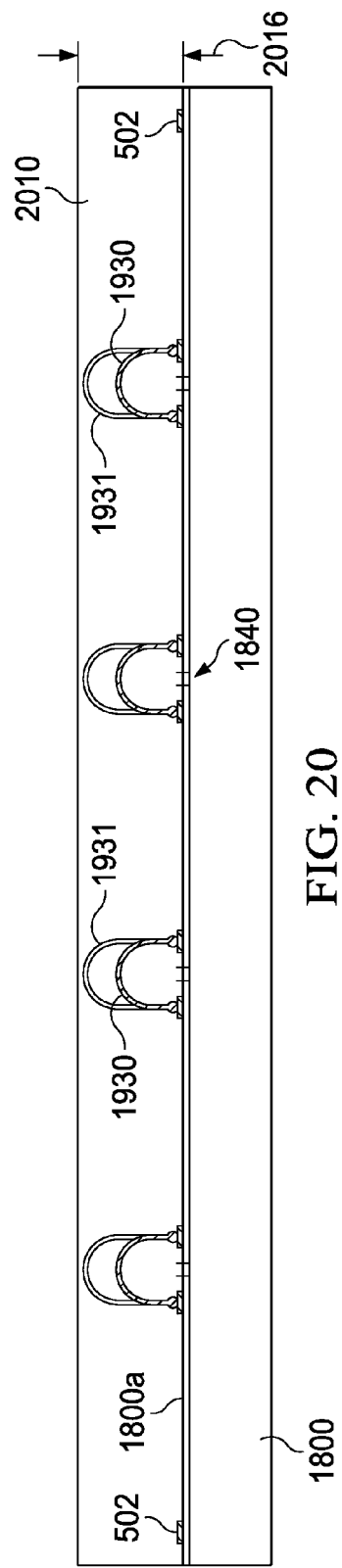
FIG. 20 is a wafer cross section showing the process step of depositing a layer of insulating material on the chip surface, covering the wire heights.

FIG. 16 indicates as the next step a back-grinding or polishing process to remove a thickness 1610 from hardened insulating material 1510 and thus reduce the height 1516 of the hardened insulating layer to the thickness 116 of device 100 indicated in FIG. 1. However, in the course of the back-grinding process, not only portions of hardened insulating material are removed, but also the tops of the wire loops 1430 and 1431, as indicated by dotted outlines in FIG. 14. The newly created surface 110a of the insulating material thus includes the cuts 1430b through wires 1430 and cuts 1431b through wires 631; see FIGS. 14 and 17. How these wire ends 1430b and 1431b are transformed into contact nodes 120 on surface 110a, is described above by the process steps illustrated in FIGS. 2 to 4. FIG. 17 further includes saw lines 641 along scribe streets 640, which cut through the insulating and semiconductor materials of the wafer to create discrete devices.

Figure 21:
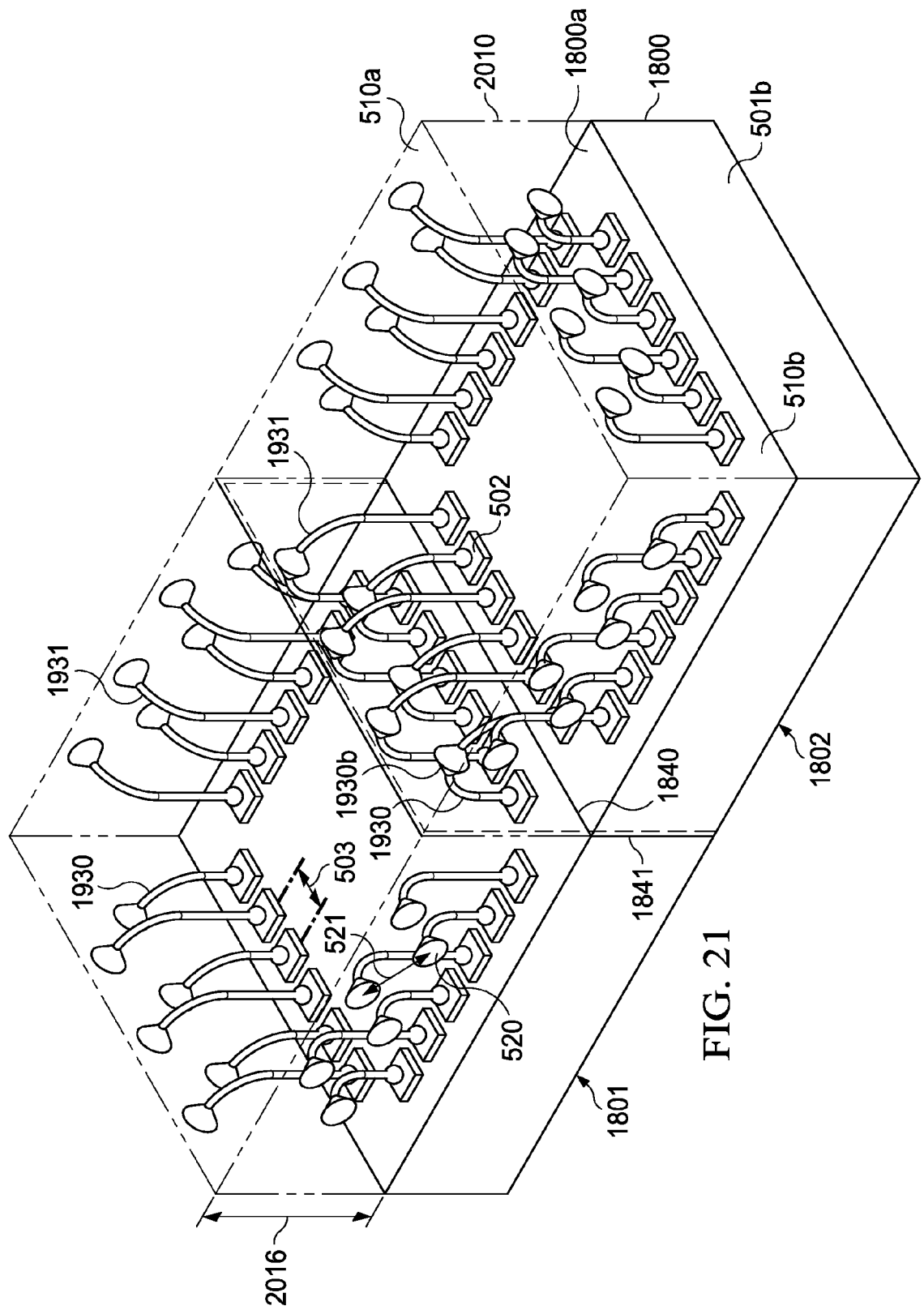
FIG. 21 illustrates a perspective view of a wafer portion including two adjacent chips showing the process steps of FIGS. 19 and 20.

Another embodiment is a process flow to fabricate a device with large-pitch staggered arrays of contact nodes on the sidewalls of the device, magnifying the small-pitch linear arrays of bonding pads of the chip, resulting in a device structure as shown in FIG. 1. Certain steps of the process flow are illustrated in FIGS. 18 to 23. The process flow starts with a semiconductor wafer 1800 as shown in FIG. 18. The wafer has a first surface 1800a including a plurality of chips with circuitry and bond pads 502, and scribe streets 1840 between the chips. A couple of adjacent chips of wafer 1800, together with some of their bond pads, are depicted in FIG. 21; these adjacent chips are designated 1801 and 1802, respectively. Bond pads 502 are linearly arrayed so that adjacent pads of a chip have a first pitch 503 center-to-center. In FIG. 21, the future saw lines, following the scribe streets 1840, are designated 1841.

In the next process step, illustrated in FIG. 19, bonding wires are spanned across scribe streets 1840 between adjacent chips in order to interconnect bond pads 502, which face each other across the scribe street. Between adjacent bond pads, wires are spanned alternatively with a low arch and with a wide arch; this wire rhythm results in wire spans alternatively with a first height (so-called low arch) and a second height (so-called high arch), wherein the second height is greater than the first height. In FIGS. 19 and 21, wires forming low arches 1930a are designated 1930 and wires forming high arches 1931a are designated 1931. Low arches 1930a may preferably be in the range from about 50 to 70 µm, high arches 1931a in the range from about 100 to 400 µm. While the height of wire arches 1931a differs greatly from the height of wire arches 1830a, the width of a high arch spans approximately the same distance as the width of a low arch, as determined by the distance of a pair of respective bond pads 502 on either side of scribe street 1840.

The spanning of wires and the curvature of the arches are computer-controlled and performed by automated wire bonders. The dimensions and the stability of the arches are determined by the wire metal (for example gold, copper, aluminum and alloys), specific weight, fabrication and thermal history, and diameter (for example more or less than 25 µm). The stiffness of the wires is selected so that wire sagging is avoided. The preferred connecting method is ball bonding; alternatively, double-stitch bonding and wedge bonding may be used.

In the next process step, illustrated in FIG. 9, an insulating low-viscosity precursor 2010 is deposited on surface 1800a of wafer 1800. The precursor may be an epoxy-based polymer as mentioned above which has been mixed with a fine distribution of inorganic fillers. Exploiting the low viscosity, the precursor is uniformly distributed for instance by spinning the wafer, without affecting the wire spans. After redistribution, precursor 2010 forms an insulating layer with an approximately uniform height 2016 sufficient to cover the apex of the arches of wires 1930 and 1931. Thereafter, precursor 2010 is subjected to a time-temperature cycle for polymerizing and hardening the polymer.

Figure 22:
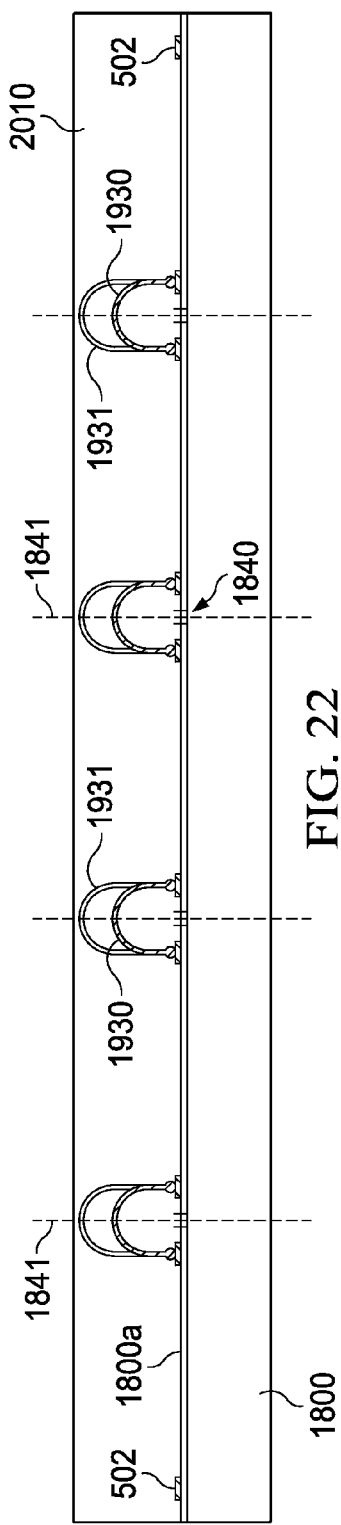
FIG. 22 depicts the process step of cutting through the insulating layer, the wire arches of different heights, and the semiconductor wafer to singulate the chips.
Figure 23:
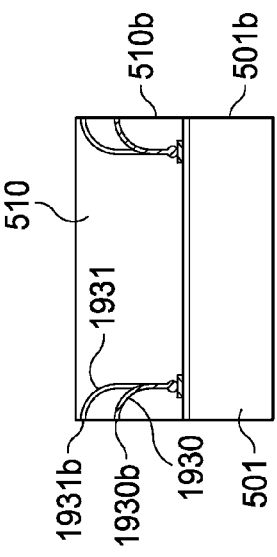
FIG. 23 shows the cross section of a singulated chip.

In the next process step, indicated in FIG. 22, chips are singulated from wafer 1800, preferably involving a sawing technique along saw lines 1841 along scribe streets 1840. The saw cuts through hardened polymeric layer 2010 and semiconductor material of wafer 1800 to create discrete devices as shown in FIG. 23. The cutting step along the saw lines explains the fact that respective side walls 501b of the semiconductor material (herein referred to as second surface) and side walls 510b of the insulting layer (herein referred to as fourth surface) are coplanar.

In the course of the sawing process through the insulating material, the arches of the wire loops 1930 and 1931 are cut. Consequently, the newly created surface 510b of the insulating material includes the cuts 1930b through wires 1930 and cuts 1931b through wires 1931; see FIG. 23. The methods to transform these wire ends 1930b and 1931b into contact nodes 520 on surface 510b, are described above by the process steps illustrated in FIGS. 2 to 4.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to products using any type of semiconductor chip, discrete or integrated circuit, and the material of the semiconductor chip may comprise silicon, silicon germanium, gallium arsenide, or any other semiconductor or compound material used in integrated circuit manufacturing.

As another example, the invention applies to semiconductor devices with chip bond pads in any arrangement, and on one or more chip sides; the invention also applies to chips with any number of bond pads.

It is therefore intended that the appended claims encompass any such modifications or embodiment.

We claim:

1. A leadframeless packaged semiconductor device comprising:
   a semiconductor chip of an area having a first surface including a plurality of bond pads, adjacent pads having a first pitch center-to-center;
   an insulating layer on the first chip surface covering the chip area, the layer having a height and a second surface over parallel to the first surface;
   the second surface including contact nodes having the same plurality as the pads, adjacent nodes having a second pitch center-to-center greater than the first pitch; and
   metal wires through the layer height connecting the pads to respective nodes, wherein neither a leadframe nor a substrate is used in the package.

2. The device of claim 1 wherein the bond pads are linearly arrayed.

3. The device of claim 1 wherein the contact nodes are in a staggered array.

4. The device of claim 1 wherein a contact node comprises a groove contiguous with the wire, the groove indented in the second surface of the insulating layer and at least partially filled with a conductive material adhering to the wire.

5. The device of claim 4 wherein the conductive material includes a conductive paste, a solder, or a z-axis conductor.

6. The device of claim 5 wherein the conductive paste or z-axis conductor are solderable.

7. The device of claim 1 wherein a contact node comprises a bump contiguous with the wire, the bump including conductive material adhering to the wire.

8. A packaged semiconductor device comprising:
   a semiconductor chip of an area having a first surface and a second surface normal to the first surface, the first surface including a plurality of bond pads, adjacent pads having a first pitch center-to-center;

an insulating layer on the first chip surface covering the chip area, the layer having a third surface over and parallel to the first surface, and a fourth surface normal to the third surface and coplanar with the second surface;

the fourth surface including contact nodes having the same plurality as the pads, adjacent nodes having a second pitch center-to-center greater than the first pitch; and metal wires traversing the layer and connecting the pads to respective nodes.

9. The device of claim 8 wherein the bond pads are linearly arrayed.

10. The device of claim 8 wherein the contact nodes are in a staggered array.

11. The device of claim 8 wherein a contact node comprises a groove contiguous with the wire, the groove indented in the fourth surface of the insulating layer and at least partially filled with a conductive material adhering to the wire.

12. The device of claim 11 wherein the conductive material includes a conductive paste, a solder, or a z-axis conductor.

13. The device of claim 12 wherein the conductive paste and z-axis conductor are solderable.

14. The device of claim 8 wherein a contact node comprises a bump contiguous with the wire, the bump including conductive material adhering to the wire.

15. A method for fabricating a packaged semiconductor device comprising the steps of:

providing a semiconductor wafer having a first surface including a plurality of chips with bond pads, adjacent pads of a chip having a first pitch center-to-center;

spanning wires to interconnect bond pads across the scribe street between adjacent chips, adjacent spans having a first width alternating with a second width greater than the first width;

depositing a layer of insulating material on the first wafer surface, the layer having a height to embed the spans first and second widths;

reducing the layer height by removing insulating material together with portions of the wire spans, thereby cutting the wire spans and creating a second surface of the layer material;

forming grooves by indenting the second surface of the layer material contiguous with the cut wires, thereby exposing the wire ends; and filling the grooves at least partially with conductive material adhering to the wire ends, thereby creating contact nodes having the same plurality as the pads, adjacent nodes having a second pitch center-to-center greater than the first pitch.

16. The method of claim 15 further including, after the step of filling, the step of sawing through the insulating layer and the chip along the scribe street, thereby singulating the chips covered by the insulating layer.

17. The method of claim 15 wherein the insulating material is an epoxy-based low-viscosity precursor filled with inorganic fillers.

18. The method of claim 15 further including, after the step of depositing, the steps of:

spinning the wafer to create a uniform height of the deposited layer of insulating material; and then hardening the insulating material by polymerization.

19. A method for fabricating a packaged semiconductor device comprising the steps of:

providing a semiconductor wafer having a first surface including a plurality of chips with bond pads, adjacent pads of a chip having a first pitch center-to-center;

spanning wires to interconnect bond pads across the scribe street between adjacent chips, adjacent spans having a first height alternating with a second height greater than the first height;

depositing a layer of insulating material on the first wafer surface, the layer having a third surface, and a height suitable to embed the first and second wire heights;

sawing through the layer and the chip along the scribe street, thereby singulating the chips, cutting the wire spans and creating a second surface of the chip and a fourth surface of the layer, the second and fourth surfaces being coplanar;

forming grooves by indenting the fourth surface of the layer material contiguous with the cut wires, thereby exposing the wire ends; and filling the grooves at least partially with conductive material adhering to the wire ends, thereby creating contact nodes having the same plurality as the pads, adjacent nodes being having a second pitch center-to-center greater than the first pitch.

20. The method of claim 19 wherein the insulating material is an epoxy-based low-viscosity precursor filled with inorganic fillers.

21. The method of claim 19 further including, after the step of depositing, the steps of:

spinning the wafer to create a uniform height of the deposited layer of insulating material; and then hardening the insulating material by polymerization.

* * * * *